(12) United States Patent
Ryan

(10) Patent No.: US 11,742,822 B2
(45) Date of Patent: Aug. 29, 2023

(54) ANTENNA STRUCTURE AND ANTENNA ARRAY

(71) Applicant: AchernarTek Inc., San Diego, CA (US)

(72) Inventor: Colan Ryan, San Diego, CA (US)

(73) Assignee: ACHERNARTEK INC., San Diego, CA (US)

( * ) Notice: Subject to any disclaimer, the term of this patent is extended or adjusted under 35 U.S.C. 154(b) by 150 days.

(21) Appl. No.: 17/463,615

(22) Filed: Sep. 1, 2021

(65) Prior Publication Data

US 2022/0328966 A1 Oct. 13, 2022

Related U.S. Application Data

(60) Provisional application No. 63/173,546, filed on Apr. 12, 2021.

(51) Int. Cl.
| | |
|---|---|
| H03H 7/48 | (2006.01) |
| H03H 7/20 | (2006.01) |
| H01Q 3/36 | (2006.01) |
| H01P 1/18 | (2006.01) |
| H01Q 5/50 | (2015.01) |
| H01Q 1/38 | (2006.01) |
| H01Q 13/10 | (2006.01) |
| H01Q 1/48 | (2006.01) |
| H01Q 9/04 | (2006.01) |
| H01Q 21/06 | (2006.01) |

(52) U.S. Cl.
CPC .............. *H03H 7/48* (2013.01); *H01P 1/184* (2013.01); *H01Q 1/38* (2013.01); *H01Q 1/48* (2013.01); *H01Q 3/36* (2013.01); *H01Q 5/50* (2015.01); *H01Q 9/045* (2013.01); *H01Q 13/106* (2013.01); *H01Q 21/065* (2013.01); *H03H 7/20* (2013.01)

(58) Field of Classification Search
None
See application file for complete search history.

(56) References Cited

U.S. PATENT DOCUMENTS

| | | | |
|---|---|---|---|
| 2005/0206568 A1 | 9/2005 | Phillips et al. | |
| 2006/0273972 A1 | 12/2006 | Chandler | |
| 2007/0285314 A1* | 12/2007 | Mortazawi | ............. H01Q 15/06 343/756 |

(Continued)

*Primary Examiner* — Wilson Lee
(74) *Attorney, Agent, or Firm* — McClure, Qualey & Rodack, LLP

(57) ABSTRACT

An antenna structure and an antenna array are disclosed. The antenna structure includes first and second feeding traces, first to fourth vias and a radiator. The first feeding trace has a first meander portion that generates a 180-degree phase change along a length thereof at an operation frequency of the antenna structure. The second feeding trace has a second meander portion that generates a 180-degree phase change along a length thereof at the operation frequency of the antenna structure. The first and second vias are respectively coupled to two opposite points of the first feeding trace with respect to the first meander portion. The third and fourth vias are respectively coupled to two opposite points of the second feeding trace with respect to the second meander portion. The radiator coupled to the first to fourth vias. The antenna array includes antenna cells each with the antenna structure.

20 Claims, 5 Drawing Sheets

(56) References Cited

U.S. PATENT DOCUMENTS

| | | | |
|---|---|---|---|
| 2015/0255867 A1* | 9/2015 | Inoue | H01Q 21/065 |
| | | | 343/853 |
| 2016/0091544 A1* | 3/2016 | Daneshmand | G01N 22/00 |
| | | | 324/633 |
| 2016/0261039 A1* | 9/2016 | Parsche | H01Q 9/0457 |
| 2019/0393729 A1* | 12/2019 | Contopanagos | H02J 50/005 |
| 2020/0278454 A1* | 9/2020 | Feller | G01S 19/36 |

\* cited by examiner

ANTENNA STRUCTURE AND ANTENNA ARRAY

RELATED APPLICATIONS

This application claims priority to U.S. Provisional Application Ser. No. 63/173,546, filed Apr. 12, 2021, which is herein incorporated by reference.

BACKGROUND

Field of the Invention

The disclosure relates to antenna technology, and more particularly to an antenna structure and an antenna array.

Description of Related Art

5G New Radio (NR) is a recently developed radio access technology that supports high throughput, low latency and large capacity communications. In comparison with previous 4G radio communication systems, a 5G NR device may use a millimeter wave (mmWave) carrier signal to up-convert baseband data into a radio frequency (RF) signal for radio transmissions. At the same time in response to market orientation, most communication products, such as smartphones, 5G femtocells, etc., have recently moved toward compact and low cost specifications. Thus, how to design an antenna with low manufacturing cost as well as great performance for mmWave communication systems (e.g., 5G and/or beyond 5G) has become one of the goals of those skilled in the related art.

SUMMARY

One aspect of the present disclosure directs to an antenna structure which includes a first feeding trace, a second feeding trace, a first via, a second via, a third via, a fourth via and a radiator. The first feeding trace has a first meander portion that generates a 180-degree phase change along a length thereof at an operation frequency of the antenna structure. The second feeding trace has a second meander portion that generates a 180-degree phase change along a length thereof at the operation frequency of the antenna structure. The first via and the second via are respectively coupled to two opposite points of the first feeding trace with respect to the first meander portion. The third via and the fourth via are respectively coupled to two opposite points of the second feeding trace with respect to the second meander portion. The radiator is coupled to the first to fourth vias.

In accordance with one or more implementations of the present disclosure, the antenna structure further includes a grounding plate which is vertically between or below the radiator and the first and second feeding traces.

In accordance with one or more implementations of the present disclosure, the antenna structure further includes a first dielectric layer and a second dielectric layer. The first dielectric layer is interposed between the grounding plate and the first and second feeding traces. The second dielectric layer is interposed between the grounding plate and the radiator.

In accordance with one or more implementations of the present disclosure, the first feeding trace and the second feeding trace are in the same metal layer.

In accordance with one or more implementations of the present disclosure, the radiator is a metal patch.

In accordance with one or more implementations of the present disclosure, the first and second vias are symmetric with respect to a center of the antenna structure.

In accordance with one or more implementations of the present disclosure, the third and fourth vias are symmetric with respect to a center of the antenna structure.

In accordance with one or more implementations of the present disclosure, a phase difference between a feed point of the first feeding trace and a feed point of the second feeding trace is applied.

In accordance with one or more implementations of the present disclosure, the first to fourth vias are respectively at four vertices of a square in a planar direction of the antenna structure.

In accordance with one or more implementations of the present disclosure, the first to fourth vias are covered by the radiator in the planar direction of the antenna structure.

Another aspect of the present disclosure is directed to an antenna structure which includes a first feed network, a second feed network and a radiator. The first feed network has a first meander, and phases at two ends of the first meander differ by substantially 180 degrees. The second feed network has a second meander, and phases at two ends of the second meander differ by substantially 180 degrees. The radiator is coupled to the two ends of the first meander and the two ends of the second meander.

In accordance with one or more implementations of the present disclosure, the radiator is a metal patch.

In accordance with one or more implementations of the present disclosure, the two ends of the first meander are symmetric with respect to a center of the antenna structure, the two ends of the second meander are symmetric with respect to the center of the antenna structure, and the two ends of the first meander and the two ends of the second meander are respectively at four vertices of a square in a planar direction of the antenna structure.

In accordance with one or more implementations of the present disclosure, the first meander and the second meander are covered by the radiator in the planar direction of the antenna structure.

In accordance with one or more implementations of the present disclosure, a phase difference between a feed point of the first feed network and a feed point of the second feeding network is applied.

In accordance with one or more implementations of the present disclosure, the antenna structure further includes a grounding plate which is between or below the radiator and the first and second meanders.

Yet another aspect of the present disclosure is directed to an antenna array which includes plural antenna cells arranged in an array. Each antenna cell includes a first feed network, a second feed network and a radiator. In the same antenna cell, the first feeding trace has a first meander portion that generates a 180-degree phase change along a length thereof at an operation frequency of the antenna structure; the second feeding trace has a second meander portion that generates a 180-degree phase change along a length thereof at the operation frequency of the antenna structure; the first via and the second via are respectively coupled to two opposite points of the first feeding trace with respect to the first meander portion; the third via and the fourth via are respectively coupled to two opposite points of the second feeding trace with respect to the second meander portion; the radiator is coupled to the first to fourth vias.

In accordance with one or more implementations of the present disclosure, the radiators of the antenna cells are coplanar, and wherein the first and second feeding traces of the antenna cells are coplanar.

In accordance with one or more implementations of the present disclosure, the antenna array further includes a grounding plate which is between or below the radiators of the plurality of antenna cells and the first and second feeding traces of the plurality of antenna cells.

In accordance with one or more implementations of the present disclosure, the antenna cells are physically separated.

BRIEF DESCRIPTION OF THE DRAWINGS

The foregoing aspects and many of the accompanying advantages of this disclosure will become more readily appreciated as the same becomes better understood by reference to the following detailed description, when taken in conjunction with the accompanying drawings.

DETAILED DESCRIPTION

The detailed explanation of the disclosure is described as following. The described preferred embodiments are presented for purposes of illustrations and description, and they are not intended to limit the scope of the disclosure.

Terms used herein are used only to describe the specific embodiments, which are not used to limit the claims appended herewith. Unless limited otherwise, the term "a," "an," "one" or "the" of the single form may also represent the plural form.

The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the following description and claims, the term "coupled" along with their derivatives, may be used. In particular embodiments, "coupled" may be used to indicate that two or more elements are in direct physical or electrical contact with each other, or may also mean that two or more elements may not be in direct contact with each other. "Coupled" may still be used to indicate that two or more elements cooperate or interact with each other.

It will be understood that, although the terms "first," "second," "third," . . . etc., may be used herein to describe various signals, elements and/or components, these signals, elements and/or components, should not be limited by these terms. These terms are only used to distinguish signals, elements and/or components.

Figure 1:
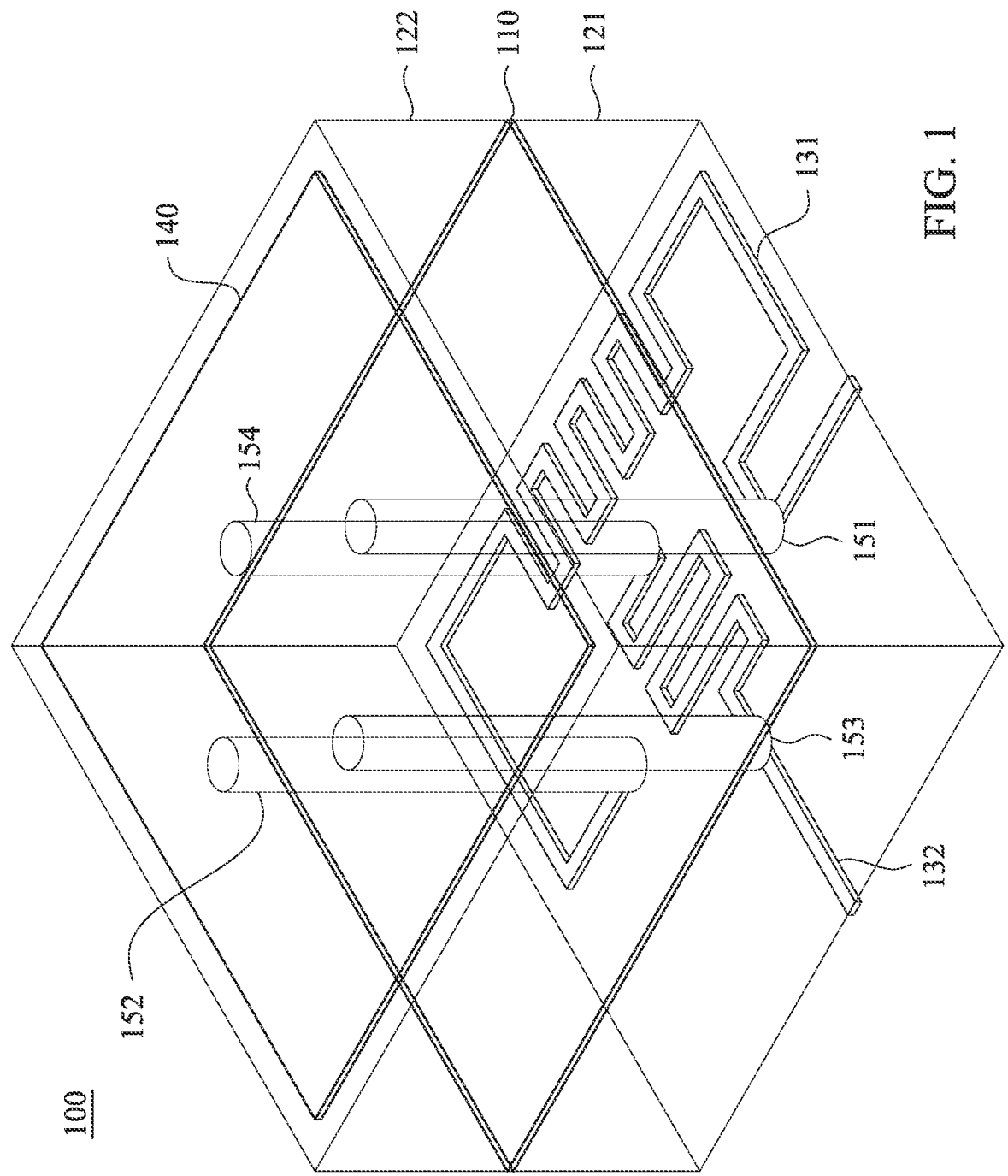
FIG. 1 is a stereoscopic perspective view of an antenna structure in accordance with some implementations of the present disclosure.

FIG. 1 is a stereoscopic perspective view of an antenna structure 100 in accordance with some implementations of the present disclosure. In the antenna structure 100, dielectric layers 121 and 122 are respectively at two opposite sides of a grounding plate 110. Feeding traces 131 and 132 are over the dielectric layer 121 and opposite to the grounding plate 110. The feeding traces 131 and 132 may be in the same metal layer below the grounding plate 110 as shown in FIG. 1. In such case, the feeding traces 131 and 132 are non-overlapped in the planar view of the antenna structure 100.

A radiator 140 is over the dielectric layer 122 and opposite to the grounding plate 110. As shown in FIG. 1, the grounding plate 110 is interposed between the radiator 140 and the feeding traces 131 and 132 for blocking electromagnetic radiation from the radiator 140 to the feeding traces 131 and 132. The radiator 140 may be a metal patch with a square shape, a rectangular shape or another suitable shape. The arrangement of the grounding plate 110, the feeding traces 131 and 132 and the radiator 140 is not limited to that shown in FIG. 1. For example, the feeding traces 131 and 132 can be disposed between the radiator 140 and the grounding plate 110 in some other implementations.

Vias 151-154 penetrate through the grounding plate 110 and the dielectric layers 121 and 122 to electrically couple the radiator 140. The feeding trace 131 is electrically coupled to the vias 151 and 152, while the feeding trace 132 is electrically coupled to the vias 153 and 154. Each of the vias 151-154 may have a right circular cylinder shape. In addition, the vias 151-154 may have the same length and/or the same diameter. The material of the grounding plate 110, the feeding traces 131 and 132, the radiator 140 and the vias 151-154 may be formed form copper, aluminum, nickel and/or another metal, a mixture or a metal alloy thereof, an electrically conductive metallic compound, and/or another suitable material. The dielectric layers 121 and 122 may be formed from FR4 material, glass, ceramic, epoxy resin, silicon, and/or another suitable material. In some implementations, each of the dielectric layers 121 and 122 may be formed of plural dielectric sublayers with different dielectric materials.

Figure 2:
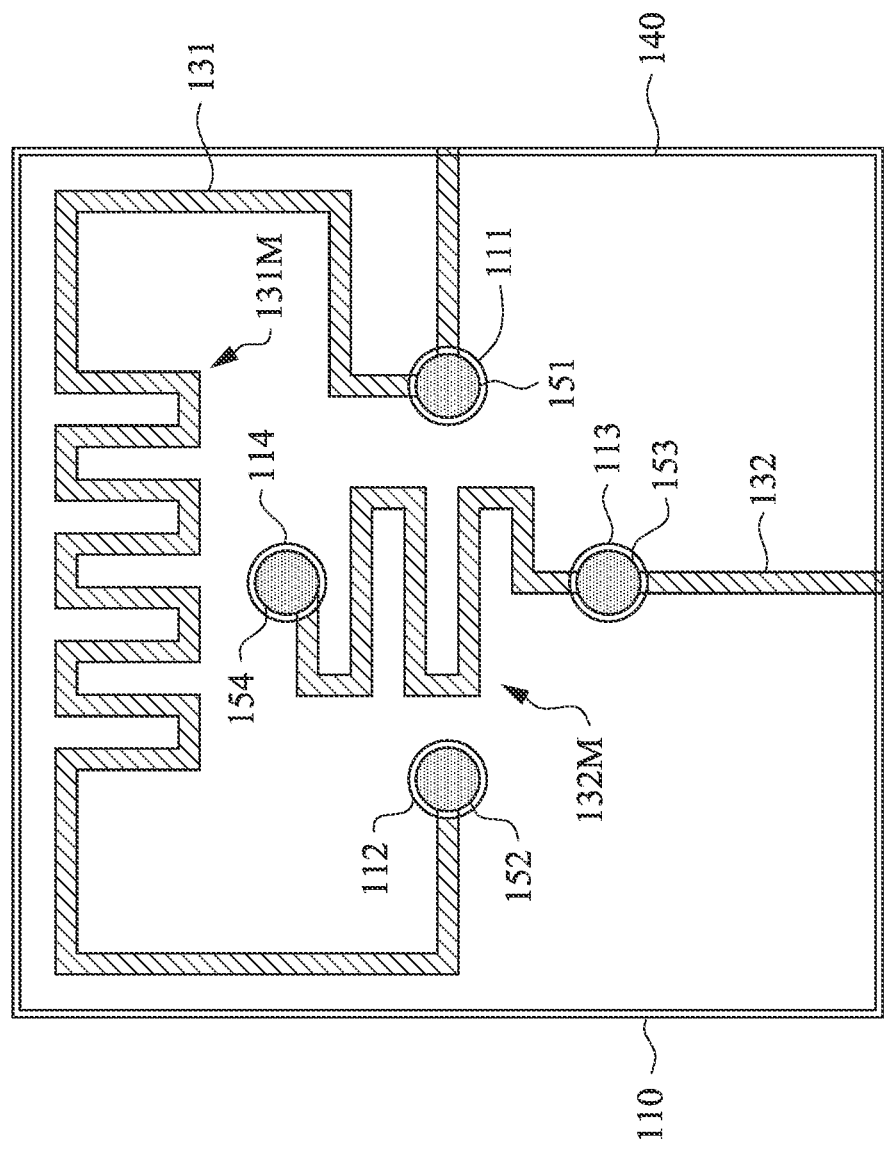
FIG. 2 is a top perspective view of the antenna structure in FIG. 1.

FIG. 2 is a top perspective view of the antenna structure 100 in FIG. 1. As shown in FIG. 2, the grounding plate 110 has four openings 111-114 through which the vias 151-154 respectively penetrate. Each of the openings 111-114 may be a circular opening, and similar to the vias 151-154, the opening 111-114 may have the same diameter. The diameter of each of the openings 111-114 is larger than that of each of the vias 151-154, such that the vias 151-154 are noncontacted from the grounding plate 110. In some other implementations, the grounding plate 110 does not have any opening, and the feeding traces 131 and 132 are disposed between the radiator 140 and the grounding plate 110.

The antenna structure 100 has two feed networks. Between these feed networks, a first feed network is formed of the feeding trace 131 and the vias 151 and 152, while a second feed network is formed of the feeding trace 132 and the vias 153 and 154. The first and second feed networks are configured to generate dual-polarized radiation on the radiator 140. For example, the first and second feed networks may respectively generate horizontally polarized radiation and vertically polarized radiation, and the direction of the horizontally polarized radiation may be perpendicular to that of the vertically polarized radiation.

The vias 151 and 152 are symmetric with respect to the center of the antenna structure 100. That is, the vias 151 and 152 are respectively at right and left sides with respect to the center of the grounding plate 110, and the center point of the grounding plate 110 may be substantially at the midpoint of the shortest path between the vias 151 and 152. Similarly, the vias 153 and 154 are symmetric with respect to the center of the antenna structure 100. That is, the vias 153 and 154 are respectively at lower and upper sides with respect to the center of the grounding plate 110, and the center point of the grounding plate 110 may be substantially at the midpoint of the shortest path between the vias 153 and 154. As shown in FIG. 2, the vias 151-154 may be respectively at four vertices of a square, a rhombus or a rectangle and/or may be covered by the radiator 140 in the planar direction of the antenna structure 100. The planar distance between the vias 151 and 152 may be the same as that between the vias 153 and 154.

In the first feeding network, the feeding trace 131 is a single-ended trace and has a meander portion 131M with plural number of turns. The feed point of the feeding trace 131 may be at the right side edge of the antenna structure 100, and the feeding trace 131 extends from right to left of the antenna structure 100. Similarly, in the second feeding network, the feeding trace 132 is a single-ended trace and has a meander portion 132M with plural number of turns. The number of turns of each of the meander portions 131M and 132M may be modified depending on the design requirements of the antenna structure 100, and is not limited to that shown in FIG. 2. The meander portions 131M and 132M may be covered by the radiator 140 in the planar direction of the antenna structure 100. In addition, the length of each segment in the meander portions 131M and 132M may be adjusted depending on the design requirements of the antenna structure 100.

The via 151 is located at the path between the feed point and the extending end of the feeding trace 131, and the via 152 is located at the extending end of the feeding trace 131. The feed point of the feeding trace 132 may be at the lower side edge of the antenna structure 100, and the feeding trace 132 extends from lower to upper of the antenna structure 100. The via 153 is located at the path between the feed point and the extending end of the feeding trace 132, and the via 154 is located at the extending end of the feeding trace 132.

Each of the meander portions 131M and 132M may produce a 180-degree phase change along its length at an operation frequency of the antenna structure 100, such that the phase difference between the points of the feeding trace 131 respectively corresponding to the vias 151 and 152 is about 180 degrees for differential feeding, and the phase difference between the points of the feeding trace 132 respectively corresponding to the vias 153 and 154 is about 180 degrees for differential feeding. In addition, the phase difference between the feed points of the feeding traces 131 and 132 may be about 90 degrees for orthogonal polarization. Besides 90 degrees, the phase difference between the feed points of the feeding traces 131 and 132 may be any other values including zero degree for various applications.

In some implementations, as shown in FIG. 2, the meander portion 131M of the feeding trace 131 is near the upper side edge of the antenna structure 100, and the meander portion 132M of the feeding trace 132 is in the center region of the antenna structure 100.

In the implementations shown in FIGS. 1 and 2, the feeding traces 131 and 132 are located in the same metal layer, and the vias 151-154 may have the same length, such that the thickness and the manufacture cost of the antenna structure 100 can be reduced.

Figure 3:
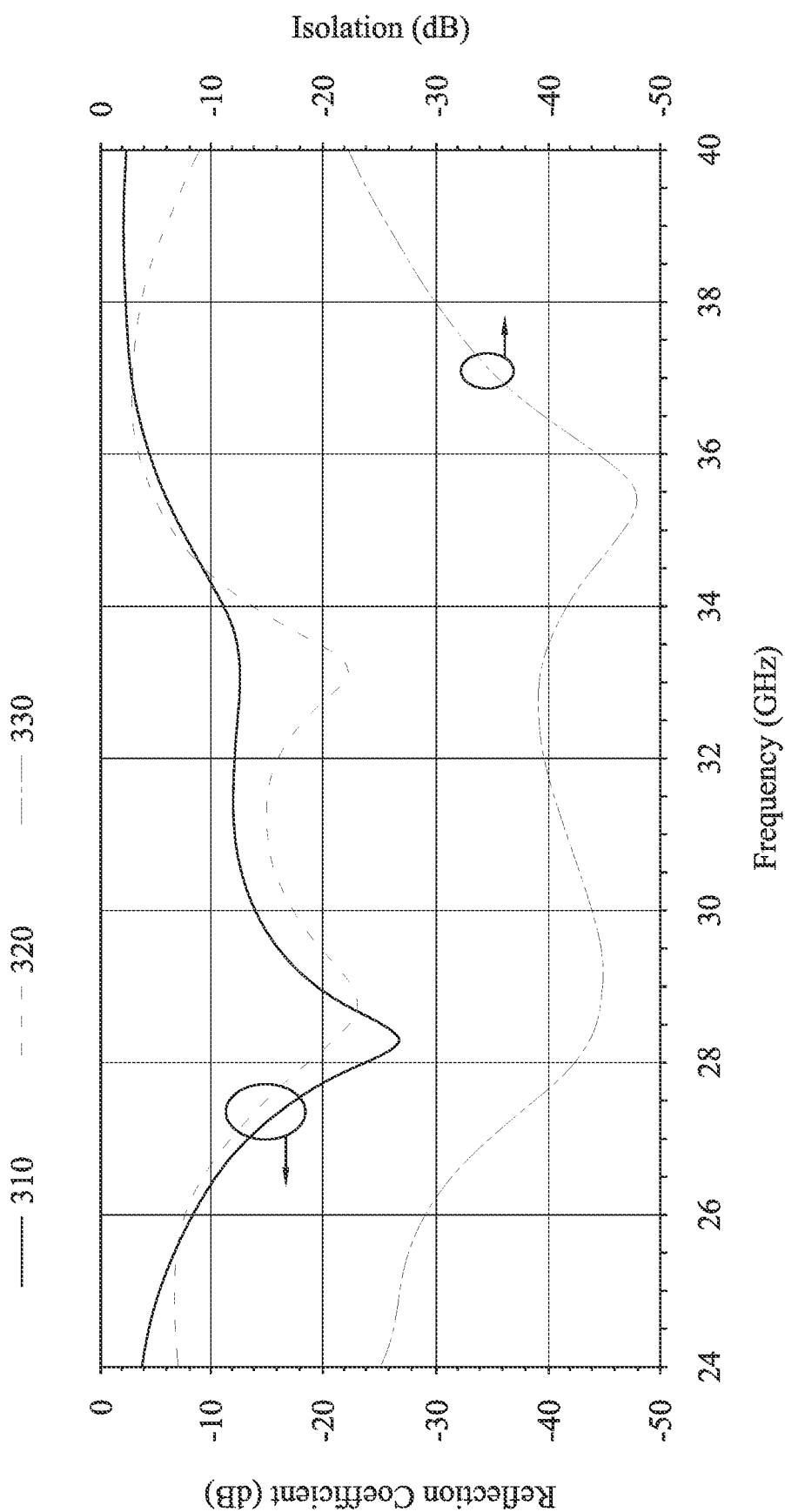
FIG. 3 is a plot depicting the reflection coefficient magnitude and the isolation performance of the two feed points of the antenna structure shown in FIGS. 1 and 2.

FIG. 3 is a plot depicting the reflection coefficient and the isolation performance of the two feed points of the antenna structure 100 shown in FIGS. 1 and 2. In FIG. 3, the curve 310 represents the reflection coefficient magnitude of the first feed network, the curve 320 represents the reflection coefficient magnitude of the second feed network, and the curve 330 represents the isolation performance between the first feed network and the second feed network. As shown in FIG. 3, the frequency band in which the reflection coefficient magnitude of the first feed network is less than −10 dB is in a range from about 26.4 GHz to about 34.3 GHz, the frequency band in which the reflection coefficient magnitude of the second feed network is less than −10 dB is in a range from about 26.7 GHz to about 34.4 GHz, and the frequency range in which isolation performance between the first feed network and the second feed network is less than −39 dB is in a range from 27.6 dB to about 36.5 dB. As can be seen from above, the antenna structure 100 provides high polarization isolation between two different feed networks. Moreover, the antenna structure 100 provides a wide impedance bandwidth for each feed network.

Figure 4:
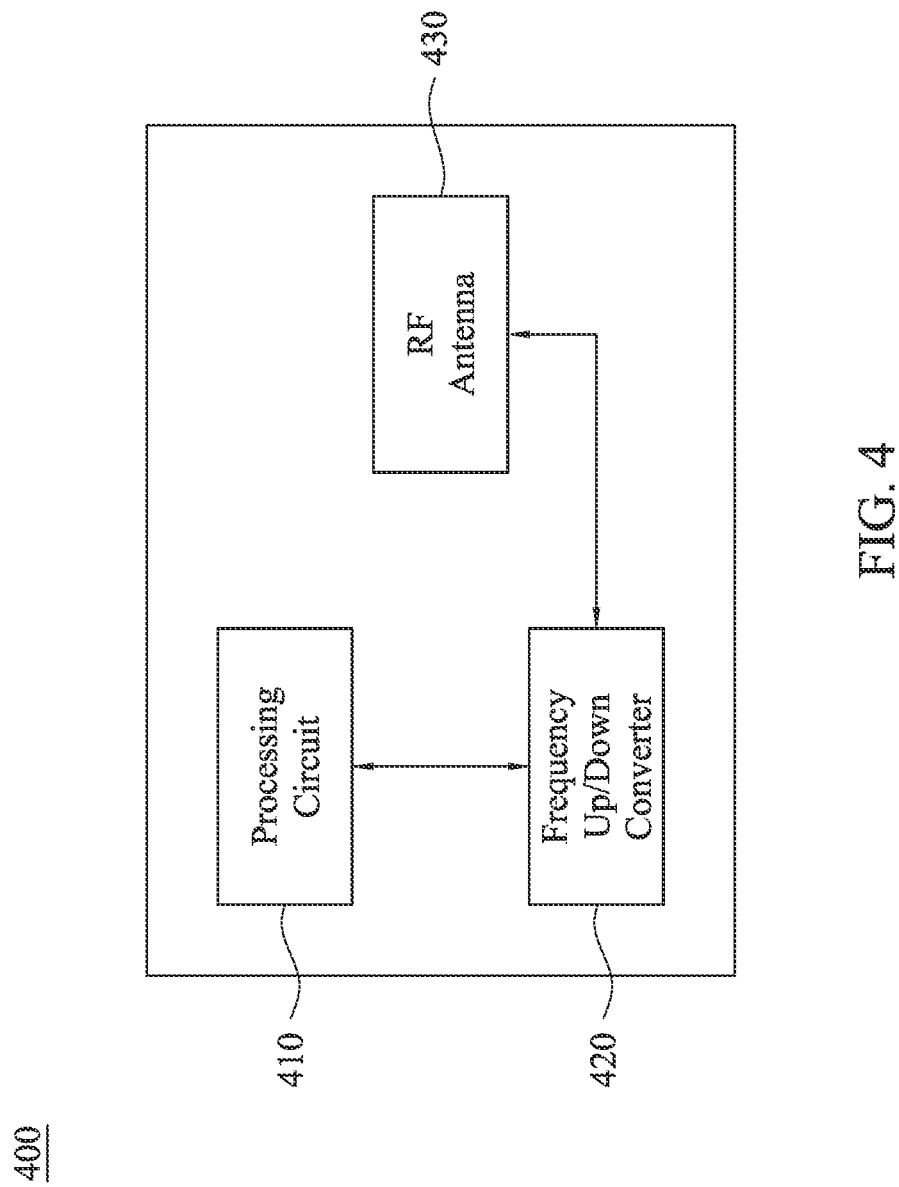
FIG. 4 is a schematic block diagram of a communication module in accordance with some implementation of the present disclosure.

FIG. 4 is a schematic block diagram of a communication module 400 in accordance with some implementation of the present disclosure. The communication module 400 includes a processing circuit 410, a frequency up/down converter 420 and an RF antenna 430. The processing circuit 410 may be configured to encode data bits to generate a coded baseband signal and decode the baseband signal from the frequency up/down converter 420 into data bits according to a protocol stack, such as Radio Resource Control (RRC), Media Access Control (MAC), Radio Link Control (RLC), Service Data Adaptation Protocol (SDAP), Packet Data Convergence Protocol (PDCP), physical layer (PHY) coding and decoding and/or the like. The processing circuit 410 may be a processor, a microprocessor, an application-specific integrated circuit (ASIC), a digital signal processor (DSP), a field programmable gate array (FPGA), and/or the like. The frequency up/down converter 420 may be configured to modulate the baseband signal outputted by the processing circuit 410 into an RF signal for radio transmissions through the RF antenna 430. In addition, the frequency up/down converter 420 may also be configured to demodulate the RF signal received through the RF antenna 430 to a baseband signal. The RF antenna 430 is configured to perform RF signal transmissions and receptions through air. The RF antenna 430 may include the antenna structure 100 shown in FIGS. 1 and 2. In some implementations, plural antenna cells each having the antenna structure 100 may also be arranged in the RF antenna 430 of the communication module 400 to form an antenna array (e.g., a phased antenna array).

Figure 5:
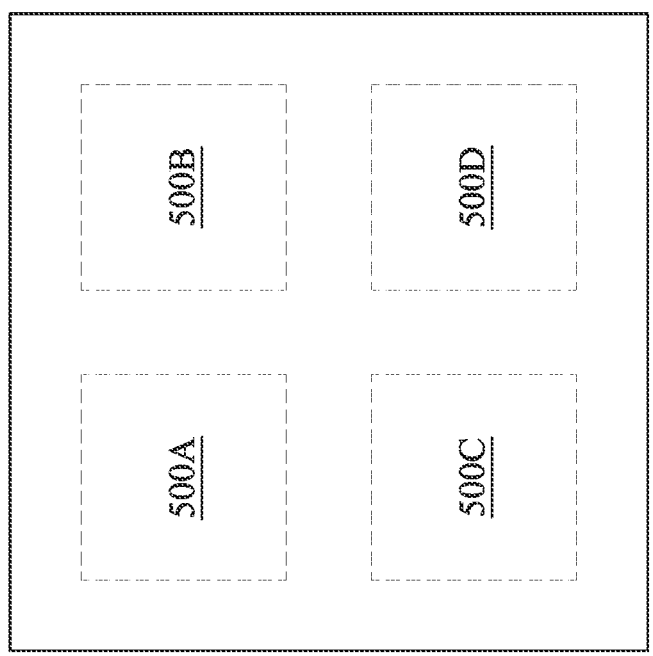
FIG. 5 is a schematic diagram of an antenna array in accordance with some implementations of the present disclosure.

FIG. 5 is a schematic diagram of an antenna array 500 in accordance with some implementations of the present disclosure. The antenna array 500 may be a phased antenna array or a combination of individual antenna modules, and may be packaged with a radio-frequency integrated circuit (RFIC), a printed circuit board (PCB) and/or another electrical element to form a radio frequency (RF) module, and may be used as a multiple-input multiple-output (MIMO) antenna for various applications, such as 5G NR (New Radio), WiFi, etc.

In some examples, as shown in FIG. 5, the antenna array 500 has four antenna cells 500A-500D arranged in an array of two rows and two columns. Each of the antenna cells 500A-500D may have a structure similar to the antenna structure 100 shown in FIGS. 1 and 2. The antenna array 500 may be a stacked structure of plural metal layers (e.g., a first metal layer with the radiator 140, a second metal layer with the grounding plate 110 and a third metal layers with the feeding traces 131 and 132 shown in FIG. 1) and plural dielectric layers (e.g., the dielectric layers 121 and 122 shown in FIG. 1). In particular, in some implementations, the metal layers are alternately stacked with the dielectric layers in the normal direction of the antenna array 500. In such stacked structure, the antenna cells 500A-500D may be concurrently formed, and the stacked metal layers and dielectric layers extend crossing the antenna cells 500A-500D. That is, the dielectric layers and the metal layers of the antenna cells 500A-500D are respectively coplanar and are respectively connected with each other. Another arrangement and/or number of antenna cells may be made for various applications. In some other examples, the antenna cells 500A-500D may be individual antenna modules. In particular, the antenna cells 500A-500D may be physically separated and each has a structure similar to the antenna structure 100 shown in FIGS. 1 and 2.

The antenna structure 100 shown in FIGS. 1 and 2 may be modified in various implementations according to the present disclosure. For example, in some implementations, the feeding traces 131 and 132 may be in two different metal layers vertically below the grounding plate 110. In such case, the feeding trace 131 may overlap with the feeding trace 132 in the planar view of the antenna structure 100, but not contact the feeding trace 132. In addition, the meander portion 131M of the feeding trace 131 and the meander portion 132M of the feeding trace 132 may be located near to the same side edge or respectively near to different side edges of the antenna structure 100, or alternatively may be all located in the center region of the antenna structure 100.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims.

What is claimed is:

1. An antenna structure comprising:
a first feeding trace having a first meander portion that generates a 180-degree phase change along a length thereof at an operation frequency of the antenna structure;
a second feeding trace having a second meander portion that generates a 180-degree phase change along a length thereof at the operation frequency of the antenna structure;
a first via and a second via respectively coupled to two opposite points of the first feeding trace with respect to the first meander portion;
a third via and a fourth via respectively coupled to two opposite points of the second feeding trace with respect to the second meander portion; and
a radiator coupled to the first to fourth vias.

2. The antenna structure of claim 1, further comprising:
a grounding plate vertically between or below the radiator and the first and second feeding traces.

3. The antenna structure of claim 2, further comprising:
one or more first dielectric layers interposed between the grounding plate and the first and second feeding traces; and
one or more second dielectric layers interposed between the grounding plate and the radiator.

4. The antenna structure of claim 1, wherein the first feeding trace and the second feeding trace are in the same metal layer.

5. The antenna structure of claim 1, wherein the radiator is a metal patch.

6. The antenna structure of claim 1, wherein the first and second vias are symmetric with respect to a center of the antenna structure.

7. The antenna structure of claim 1, wherein the third and fourth vias are symmetric with respect to a center of the antenna structure.

8. The antenna structure of claim 1, wherein a phase difference is applied between a feed point of the first feeding trace and a feed point of the second feeding trace.

9. The antenna structure of claim 1, wherein the first to fourth vias are respectively at four vertices of a square in a planar direction of the antenna structure.

10. The antenna structure of claim 9, wherein the first to fourth vias are covered by the radiator in the planar direction of the antenna structure.

11. An antenna structure comprising:
a first feed network having a first meander, wherein phases at two ends of the first meander differ by substantially 180 degrees;
a second feed network having a second meander, wherein phases at two ends of the second meander differ by substantially 180 degrees; and
a radiator coupled to the two ends of the first meander and the two ends of the second meander.

12. The antenna structure of claim 11, wherein the radiator is a metal patch.

13. The antenna structure of claim 11, wherein the two ends of the first meander are symmetric with respect to a center of the antenna structure, wherein the two ends of the second meander are symmetric with respect to the center of the antenna structure, and wherein the two ends of the first meander and the two ends of the second meander are respectively at four vertices of a square in a planar direction of the antenna structure.

14. The antenna structure of claim 13, wherein the first meander and the second meander are covered by the radiator in the planar direction of the antenna structure.

15. The antenna structure of claim 11, wherein a phase difference is applied between a feed point of the first feed network and a feed point of the second feeding network.

16. The antenna structure of claim 11, further comprising:
a grounding plate between or below the radiator and the first and second meanders.

17. An antenna array comprising:
a plurality of antenna cells arranged in an array, each of the plurality of antenna cells comprising:
a first feeding trace having a first meander portion that generates a 180-degree phase change along a length thereof at an operation frequency of the antenna array;
a second feeding trace having a second meander portion that generates a 180-degree phase change along a length thereof at the operation frequency of the antenna array;
a first via and a second via respectively coupled to two opposite points of the first feeding trace with respect to the first meander portion;
a third via and a fourth via respectively coupled to two opposite points of the second feeding trace with respect to the second meander portion; and
a radiator coupled to the first to fourth vias.

18. The antenna array of claim 17, wherein the radiators of the plurality of antenna cells are coplanar, and wherein the first and second feeding traces of the plurality of antenna cells are coplanar.

19. The antenna array of claim 18, further comprising:
a grounding plate between or below the radiators of the plurality of antenna cells and the first and second feeding traces of the plurality of antenna cells.

20. The antenna array of claim 17, wherein the plurality of antenna cells are physically separated.

* * * * *